(12) United States Patent
He et al.

(10) Patent No.: US 7,511,333 B2
(45) Date of Patent: Mar. 31, 2009

(54) NONVOLATILE MEMORY CELL WITH MULTIPLE FLOATING GATES AND A CONNECTION REGION IN THE CHANNEL

(75) Inventors: Yue-Song He, San Jose, CA (US);
Chung Wai Leung, Milpitas, CA (US);
Jin-Ho Kim, Cupertino, CA (US);
Kwok Kwok Ng, Morgan Hill, CA (US)

(73) Assignee: ProMOS Technologies Inc., Hsin Chu (TW)

( * ) Notice: Subject to any disclaimer, the term of this patent is extended or adjusted under 35 U.S.C. 154(b) by 176 days.

(21) Appl. No.: 11/246,447

(22) Filed: Oct. 6, 2005

(65) Prior Publication Data
US 2007/0120171 A1   May 31, 2007

(51) Int. Cl.
*H01L 27/115* (2006.01)
*H01L 29/66* (2006.01)

(52) U.S. Cl. ............... 257/316; 257/320; 257/E27.103; 257/E29.304; 257/E21.682; 438/257; 438/258; 438/259

(58) Field of Classification Search ................. 257/315, 257/316, 318, 390, 391, 320, E27.103, E29.304, 257/E21.682; 438/257–259
See application file for complete search history.

(56) References Cited

U.S. PATENT DOCUMENTS 5,422,504 A * 6/1995 Chang et al. ............ 365/185.15
5,495,441 A * 2/1996 Hong ..................... 365/185.01
5,705,415 A    1/1998 Orlowski et al.
5,929,479 A * 7/1999 Oyama ........................ 257/315
5,929,492 A * 7/1999 Okamura ..................... 257/365
6,433,382 B1   8/2002 Orlowski et al.

(Continued)

FOREIGN PATENT DOCUMENTS

EP          1 262 995      12/2002

(Continued)

OTHER PUBLICATIONS

Prinz, E.J. et al. "An embedded 90nm SONOS flash EEPROM utilizing hot electron injection programming and 2-sided hot hole injection erase." Motorola Embedded Memory Center, 6501 William Cannon Drive, MD:OE341, Austin, TX 78735.

*Primary Examiner*—Zandra Smith
*Assistant Examiner*—Tsz K Chiu
(74) *Attorney, Agent, or Firm*—Haynes and Boone, LLP

(57) ABSTRACT

A memory cell (110) has a plurality of floating gates (120L, 120R). The channel region (170) comprises a plurality of sub-regions (220L, 220R) adjacent to the respective floating gates, and a connection region (210) between the floating gates. The connection region has the same conductivity type as the source/drain regions (160) to increase the channel conductivity. Therefore, the floating gates can be brought closer together even though the inter-gate dielectric (144) becomes thick between the floating gates, weakening the control gate's (104) electrical field in the channel.

17 Claims, 6 Drawing Sheets

U.S. PATENT DOCUMENTS

| | | | |
|---|---|---|---|
| 6,441,430 B1 | 8/2002 | Tanigami | |
| 6,653,682 B1 | 11/2003 | Houdt et al. | |
| 6,798,015 B2 * | 9/2004 | Kasuya | 257/316 |
| 6,897,517 B2 | 5/2005 | Van Houdt et al. | |
| 6,897,533 B1 | 5/2005 | Yang et al. | |
| 2004/0119109 A1 * | 6/2004 | Kang | 257/315 |
| 2004/0129972 A1 * | 7/2004 | Kasuya | 257/324 |
| 2005/0051833 A1 * | 3/2005 | Wang et al. | 257/315 |
| 2006/0033147 A1 * | 2/2006 | Tang | 257/315 |
| 2006/0175654 A1 * | 8/2006 | Pan et al. | 257/315 |

FOREIGN PATENT DOCUMENTS

| | | |
|---|---|---|
| EP | 1 376 676 | 1/2004 |
| EP | 1 381 055 | 1/2004 |

\* cited by examiner

NONVOLATILE MEMORY CELL WITH MULTIPLE FLOATING GATES AND A CONNECTION REGION IN THE CHANNEL

BACKGROUND OF THE INVENTION

The present invention relates to integrated nonvolatile memories.

FIG. 1A is a circuit diagram of a "virtual ground" electrically programmable read only memory array (EPROM) described in W. D. Brown et al., "Nonvolatile Semiconductor Memory Technology" (IEEE Press, 1998), pages 33-35, incorporated herein by reference. FIG. 1B is a top view of the array, and FIG. 1C shows a vertical cross section A-A' (FIG. 1B) passing through a wordline 104. Each memory cell 110 is a floating gate transistor. The floating gates 120 (FIGS. 1B, 1C), made of doped polysilicon, overlie P type silicon substrate 130 (FIGS. 1C) and are insulated from the substrate by a silicon dioxide layer 140. Control gates 104 are provided by doped polysilicon wordlines. Numeral 104 denotes both the wordlines and the control gates. Each wordline 104 runs through the array in the row direction (horizontal direction in FIGS. 1A-1C). Wordlines 104 are insulated from floating gates 120 and substrate 130 by dielectric 144. Bitlines 160 are diffused regions, doped N+, in substrate 130. Each bitline traverses the array in the column direction (vertically in FIGS. 1A, 1B). Each transistor 110 has its source/drain regions provided by the adjacent bitlines 160. Channel region 170 under the floating gate 120 is a P type region extending between the source/drain regions in substrate 130.

Bitlines 160 are connected to a circuit 180 which performs bitline selection, driving and sensing as needed for the memory operation. Wordline driving circuitry (not shown) is also provided.

Cell 110 is programmed by channel hot electron injection. During the programming, the cell's wordline 104 is at a high voltage (12V), one of the cell's source/drain regions 160 (one of the bitlines) is at 8~9V, and the other source/drain region is grounded. To read the cell, the corresponding wordline is driven to 5V, one of the corresponding bitlines 160 is driven to 2V, and the other bitline is grounded. The array is erased by ultraviolet light.

SUMMARY

This section summarizes some features of the invention. Other features are described in the subsequent sections. The invention is defined by the appended claims which are incorporated into this section by reference.

In some embodiments of the present invention, a memory cell includes two floating gates between each pair of adjacent bitlines. One embodiment is shown in FIGS. 2A (circuit diagram), 2B (top view of "drawn" regions as defined by various masks, not accounting for dopant diffusion), and 2C (vertical cross section along a wordline 104). Wordlines 104, bitlines 160, and circuit 180 are arranged like in FIGS. 1A-1C, but there are two floating gate transistors 110L, 110R (with corresponding floating gates 120L, 120R) in each cell 110, i.e. in each memory row between each pair of adjacent bitlines 160. Each cell 110 can store two bits of information. Each floating gate 120L, 120R can be programmed by hot hole injection ("HH injection") or channel hot electron injection (CHEI). The cells can be erased by Fowler-Nordheim (FN) tunneling. During a read operation, one of the source/drain regions 160 is driven to a high voltage to make the adjacent portion of channel region 170 conductive regardless of the state of the corresponding floating gate 120L or 120R.

The memory structure is in some respects similar to one proposed in U.S. Pat. No. 6,897,517 issued on May 24, 2005 to Van Houdt et al., but there are important differences. In the memory of FIGS. 2A-2C, the channel region 170 includes an N type connection region 210 between the floating gates 120L, 120R. In some embodiments, connection regions 210 are permanently floating. For example, they are not connected to the bitline driving and sensing circuit 180 or to any other driver. The connection regions reduce the channel resistance between the adjacent bitlines 160. This is especially desirable if the wordlines 104 do not provide strong inversion between the adjacent floating gates 120L, 120R. Of note, if the adjacent floating gates 120L, 120R are close to each other, the inter-gate dielectric 144 can be thickened between the floating gates (see FIG. 3), thus weakening the electrical field induced by the wordlines in substrate 130 between the floating gates 120L, 120R. Connection regions 210 are desirable in this situation. In some embodiments, the connection regions are less shallow, and/or doped less heavily, than bitlines 160 in order to reduce the horizontal extent of the connection regions, thus preventing the punch-through between the connection regions and the adjacent bitline regions in program and read operations and counteracting the short channel effect.

The invention is not limited to the features and advantages described above. Other features and advantages are described below. The invention is defined by the appended claims.

DESCRIPTION OF SOME EMBODIMENTS

Figure 1A:
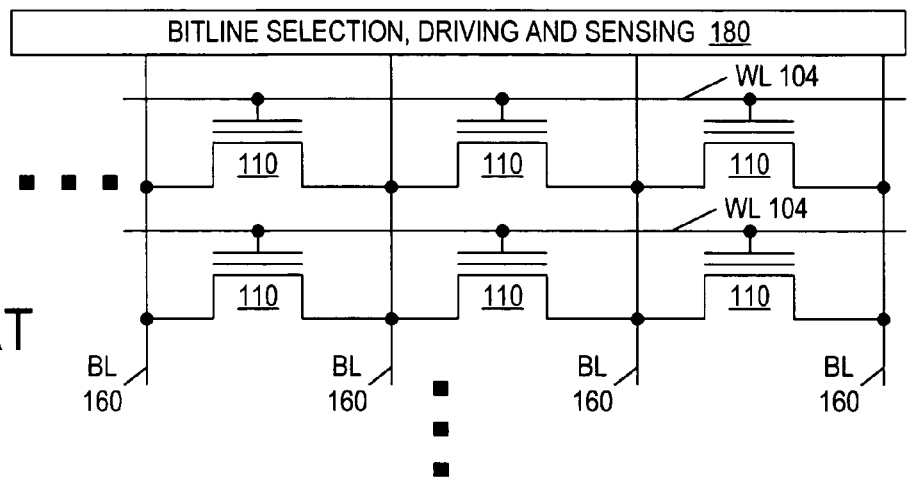
FIG. 1A is a circuit diagram of a prior art memory array.
Figure 1B:
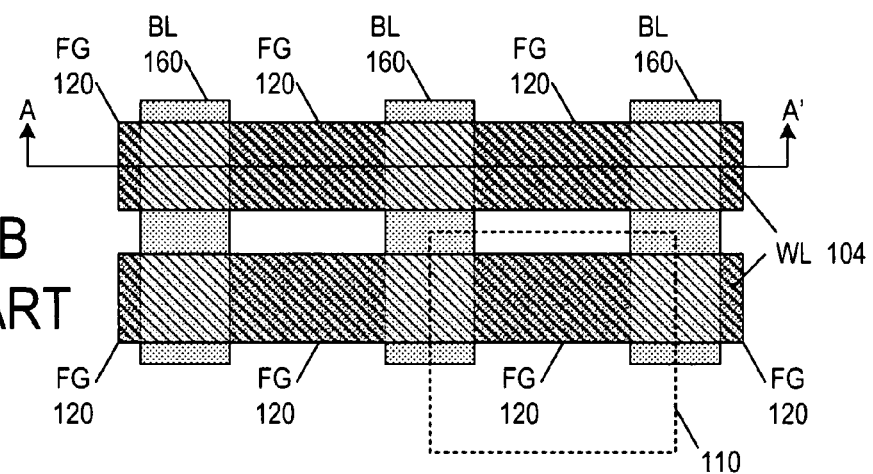
FIG. 1B is a top view of the array of FIG. 1A.
Figure 1C:
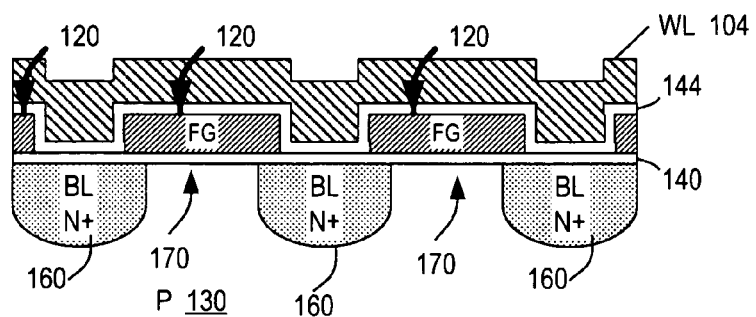
FIG. 1C shows a vertical cross section of the structure of FIG. 1B.

The embodiments described in this section illustrate but do not limit the invention. The invention is defined by the appended claims.

In the drawings, all the vertical cross sections are along a wordline unless specifically noticed otherwise.

Figure 2A:
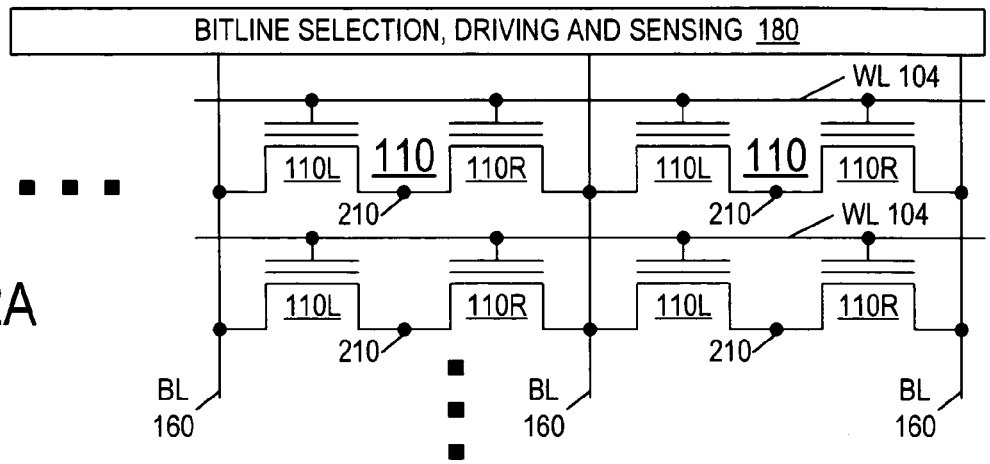
FIG. 2A is a circuit diagram of a memory array according to some embodiments of the present invention.
Figure 2B:
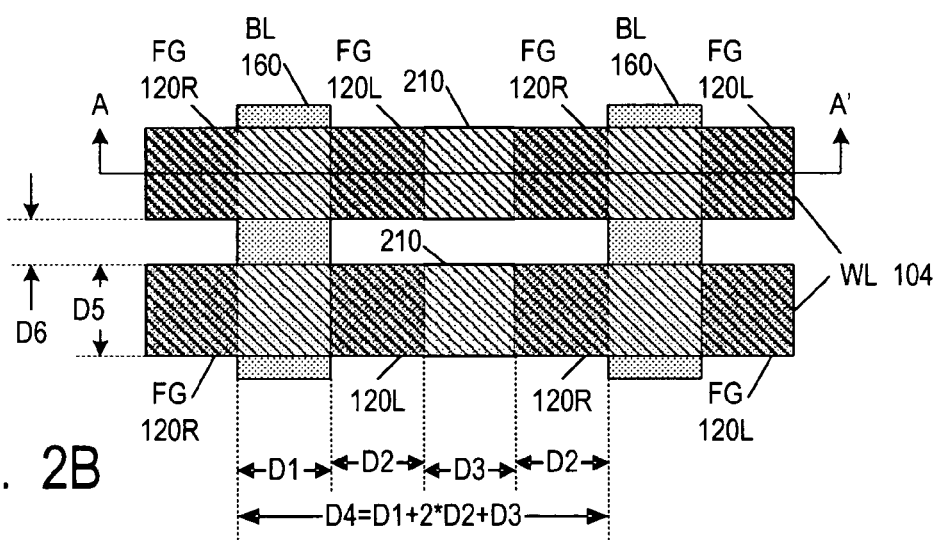
FIG. 2B is a top view of the array of FIG. 2A in some embodiments of the present invention.
Figure 2C:
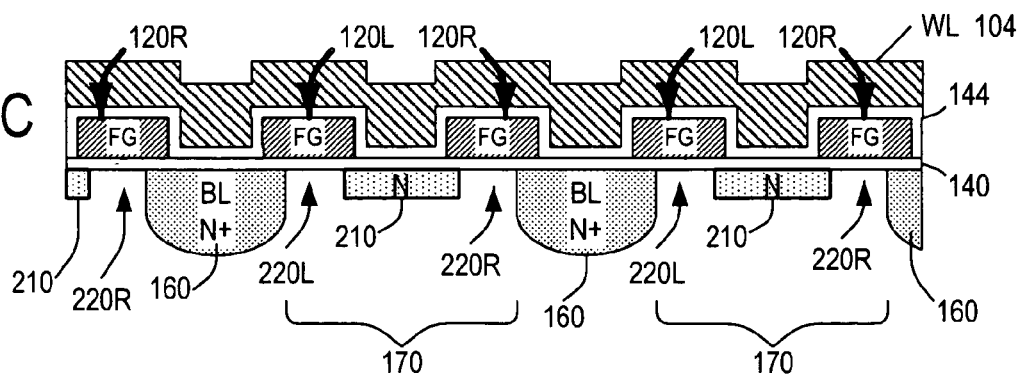
FIGS. 2C, 3 show vertical cross sections of the structure of FIG. 2B in some embodiments of the present invention.
Figure 3:
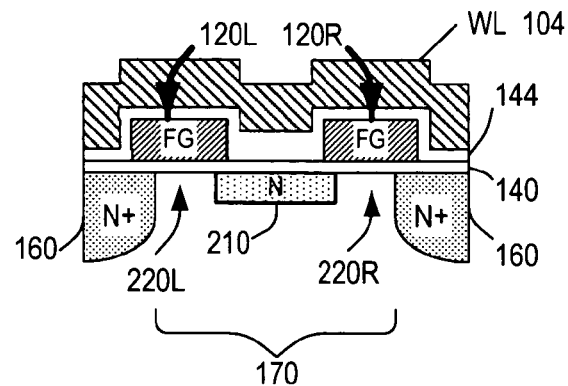

As shown in FIGS. 2A-2C, the memory cell's channel region 170 includes P doped channel sub-regions 220L, 220R adjacent to the respective floating gates 120L, 220R. In addition, the channel region 170 includes N doped connection region 210 between the sub-regions 220L, 220R. In FIG. 2B, the symbol D1 denotes the width of a bitline 160; D2 is the distance between a bitline 160 and an adjacent connection region 210; D3 is the width of a connection region; D5 is the width of a wordline 104; D6 is the spacing between the adjacent wordlines. The total memory cell width D4 in the wordline direction is D4=D1+2*D2+D3. The memory cell area $A_{cell}$=D4*(D5+D6). The area per bit is $A_{cell}/2$. In one embodiment, D1=D2=D3=0.08 μm, D5=0.13 μm, D6=0.07 μm. Therefore, D4=0.32 μm, and $A_{cell}$=0.064 μm². The minimum photolithographic line width (minimum feature size) F=0.07 μm. These dimensions are exemplary and not limiting.

In each cell 110, each transistor 110L, 110R has two states, so the cell has four states: State 1 is when both the left bit (110L) and the right bit (110R) are programmed; State 2 is when the left bit is programmed and the right bit is erased; State 3 is when the left bit is erased and the right bit is programmed; State 4 is when both the left bit and the right bit are erased. In some embodiments, the following voltages and currents are believed to be achievable.

Option 1. In this option, the cells are programmed by hot hole (HH) injection: hot holes are injected from a floating gate 120 (i.e. 120L or 120R) into substrate 130. The cells are erased by FN tunneling of electrons from channel region 170 into the floating gates 120. A whole row of cells is erased in one erase operation (a row consists of the cells sharing a wordline 104). The voltages are as follows.

TABLE 1

HH PROGRAMMING OF TRANSISTOR 110L:

| WL 104 | Left BL 160 (adjacent to floating gate 120L of the cell) | Right BL 160 (adjacent to floating gate 120R of the cell) | Substrate 130 |
|---|---|---|---|
| −8 V~−10 V | 5 V | 0 V | 0 V |

Program current: Ids=10 nA~100 nA per cell.
Threshold voltage Vt of a programmed cell is 1V~2V.
Vt of unprogrammed cell is 6V~7V.

TABLE 2

HH PROGRAMMING OF TRANSISTOR 110R:

| WL 104 | Left BL 160 | Right BL 160 | Substrate 130 |
|---|---|---|---|
| −8 V~−10 V | 0 V | 5 V | 0 V |

TABLE 3

FN ERASE:

| WL 104 | Left BL 160 | Right BL 160 | Substrate 130 |
|---|---|---|---|
| 10 V | Float | float | −10 V |

The reading operation is described below.

Option 2. In this option, the cells are programmed by channel hot electron injection (CHEI): hot electrons are injected from substrate 130 into floating gates 120. The cells are erased by FN tunneling of electrons from floating gates 120L, 120R into the respective channel regions 220L, 220R.

TABLE 4

CHEI PROGRAMMING OF TRANSISTOR 110L:

| WL 104 | Left BL 160 | Right BL 160 | Substrate 130 |
|---|---|---|---|
| 8 V~10 V | 5 V | 0 V | 0 V |

Program current: Ids=80 μA per cell.
Threshold voltage Vt of a programmed cell is 5V~6V.
Vt of unprogrammed cell is 1V~2V.

TABLE 5

CHEI PROGRAMMING OF TRANSISTOR 110R:

| WL 104 | Left BL 160 | Right BL 160 | Substrate 130 |
|---|---|---|---|
| 8 V~10 V | 0 V | 5 V | 0 V |

TABLE 6

FN ERASE:
This operation erases a row of cells 110 sharing a wordline 104.

| WL 104 | Left BL 160 | Right BL 160 | Substrate 130 |
|---|---|---|---|
| −10 V | Float | Float | 10 V |

The read operation (Table 6) can be identical for Options 1 and 2.

TABLE 6

READ THE TRANSISTOR 110L:

| WL 104 | Left BL 160 | Right BL 160 | Substrate 130 |
|---|---|---|---|
| 4.5 V~6 V | 0 V | 1.5 V~2.5 V | 0 V |

TABLE 7

READ THE TRANSISTOR 110R:

| WL 104 | Left BL 160 | Right BL 160 | Substrate 130 |
|---|---|---|---|
| 4.5 V~6 V | 1.5 V~2.5 V | 0 V | 0 V |

Read current: 10~20 μA.

The invention does not rely on the inventors' understanding of the programming or erasing mechanisms (e.g. whether the voltages of Table 1 really cause a hot hole injection or some other phenomenon leading to a transistor 110L becoming programmed). The invention is not limited to particular voltages, currents, or programming mechanisms.

Figure 4:
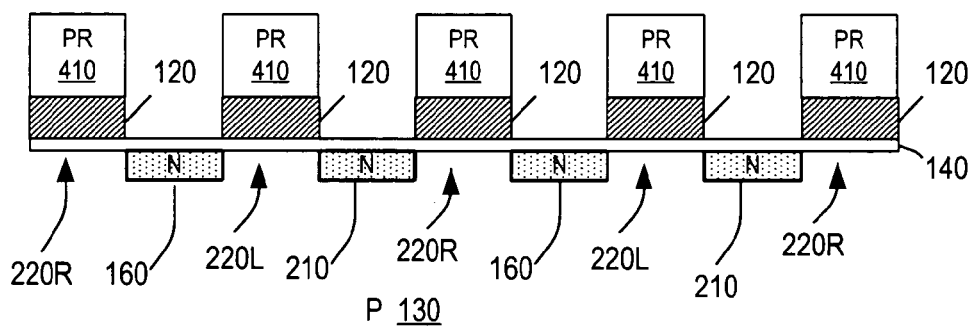
FIG. 4 shows is a vertical cross section of a memory array in the process of fabrication according to some embodiments of the present invention.
Figure 5:
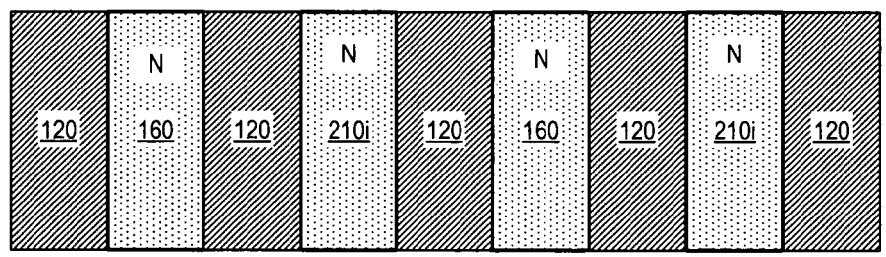
FIG. 5 is a top view of a memory array in the process of fabrication according to some embodiments of the present invention.
Figure 6:
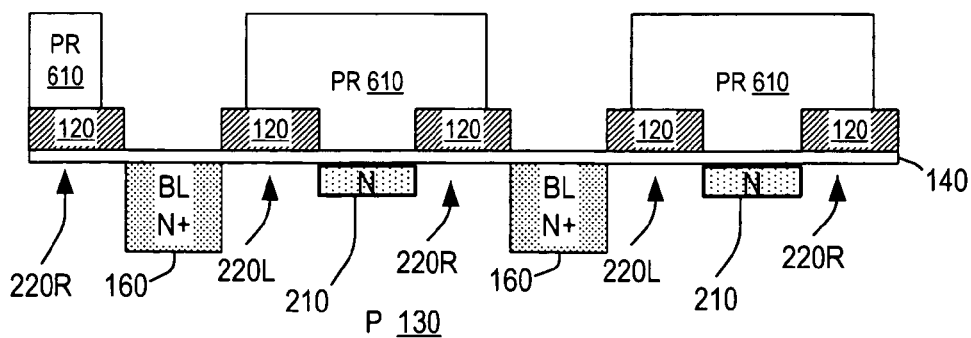
FIG. 6 shows is a vertical cross section of a memory array in the process of fabrication according to some embodiments of the present invention.

FIGS. 4-6 illustrate an exemplary fabrication method. A pad layer of silicon dioxide (not shown) is grown on P type substrate 130. A photolithographic mask ("zero layer mask", not shown) is formed to define the wafer alignment marks (not shown). The alignment marks are formed on the wafer by a suitable etch. The photoresist and the pad oxide layer are removed.

Then another mask is formed to define the threshold adjust implant regions. Suitable implants are performed into the array and/or peripheral memory regions. The mask is then removed.

Silicon oxide layer 140 ("tunnel oxide") is thermally grown to an appropriate thickness (e.g. 9~10 nm) on substrate 130. Doped polysilicon 120 is deposited on oxide 140. Photoresist mask 410 is formed on layer 120 and patterned to open a number of strips running in the column direction and including the bitline strips 160 and connection region strips 210$i$ (FIGS. 4-5). Each strip 210$i$ runs through one array column through the positions of connection regions 210. Polysilicon 120 is etched away in the strip areas 160, 210$i$ opened by the mask. Optionally, oxide 140 can also be at least partially etched away in the opened areas. An N type dopant (e.g. arsenic) is implanted to dope the strips 210$i$ and hence the connection regions 210, and to partially dope the bitlines 160. In some embodiments, ion implantation of arsenic is used at an energy of 20~30 KeV. An exemplary dopant concentration is $10^{13}$~$10^{14}$ atoms/cm$^3$. The dopant material and the concentrations and energy levels are exemplary and not limiting.

FIG. 5 is a top view of the wafer after the removal of photoresist 410. Polysilicon strips 120 run through the array in the column direction. Oxide 140 is not shown over the connection regions and the bitlines.

A photoresist layer 610 (FIG. 6) is deposited on the wafer and patterned to open the bitline regions 160 between the polysilicon strips 120 but to protect the connection regions 210. Each opening in mask 610 is a strip running through the array in the column direction over a bitline 160. The edges of these openings can be positioned anywhere over the adjacent polysilicon strips 120 since the polysilicon will also mask the bitline implant. In some embodiments, the polysilicon 120 has been doped N+, so the polysilicon 120 conductivity will not be reduced by the bitline implant.

An N type dopant is implanted to dope the bitlines. In some embodiments, ion implantation of arsenic is used at an energy of 30~40 KeV. An exemplary dopant concentration achieved is $10^{15}$ atoms/cm$^3$. The dopant material and the concentrations and energy levels are exemplary and not limiting.

Photoresist 610 is removed. Dielectric 144 (FIG. 2C) can be ONO (a sandwich of silicon dioxide, silicon nitride, silicon dioxide) or some other suitable type, formed on the wafer by standard techniques. A conductive layer 104 (for example, doped polysilicon, a silicide, a metal, or a combination of these materials) is deposited on ONO 144. A photoresist mask (not shown) is deposited on layer 104 and patterned to define the wordlines. The wordline pattern is shown in FIG. 2B. Layers 104, 144, 120, and possibly 140 are removed in the openings defined by the mask. A channel stop implant (type P) is performed into substrate 130 to dope the substrate regions between wordlines 104 using known techniques. See, for example, the aforementioned U.S. Pat. No. 6,897,517 issued to Van Houdt et al. This implant counterdopes the portions of strips 210$i$ (FIG. 5) between the wordlines 104, possibly changing their net conductivity type to P. Individual connection regions 210 in each column become thus separated, and each connection region 210 becomes surrounded by a P type region of substrate 130. The fabrication can be completed using known techniques.

Figure 7A:
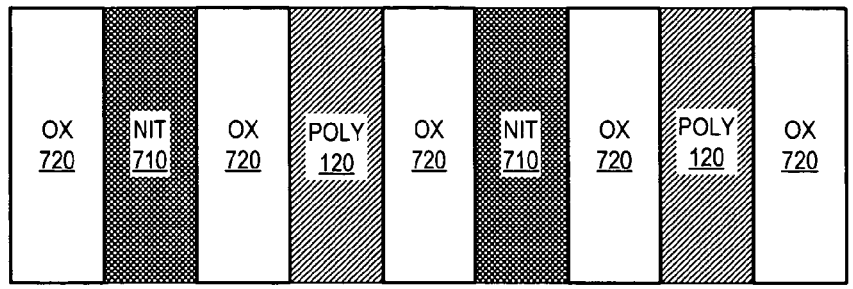
FIG. 7A is a top view of a memory array in the process of fabrication according to some embodiments of the present invention.
Figure 7B:
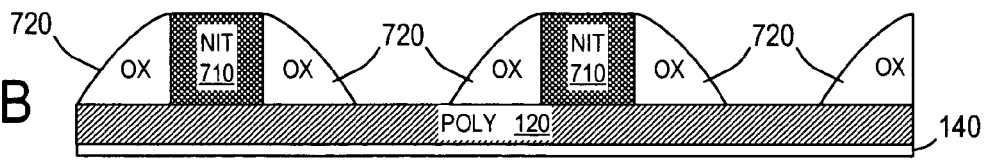
FIGS. 7B, 8, 9 show vertical cross sections of memory arrays in the process of fabrication according to some embodiments of the present invention.
Figure 8:
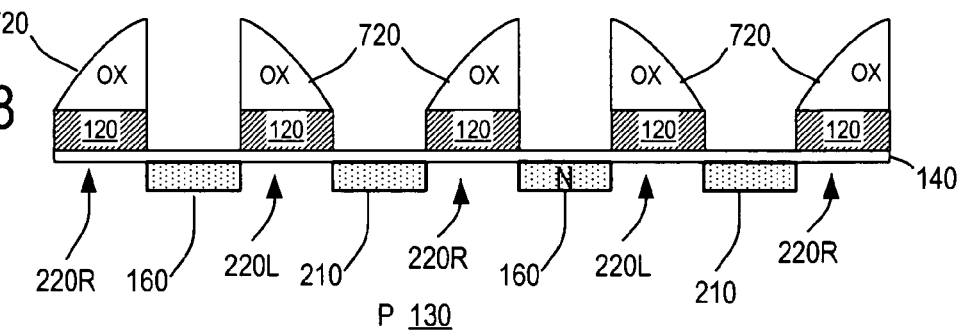

Another fabrication process is as follows. The fabrication proceeds as in FIG. 4 through the formation of tunnel oxide 140 and deposition of polysilicon layer 120. Then polysilicon 120 is patterned as follows. A silicon nitride layer 710 (FIGS. 7A, top view and FIG. 7B, vertical cross section) is deposited on polysilicon 120. Nitride 710 is patterned to form strips over future positions of bitlines 160. A silicon dioxide layer 720 is deposited on nitride 710. Oxide 720 is planarized and then etched anisotropically until the polysilicon 120 and the nitride 710 are exposed. The oxide etch leaves silicon dioxide spacers 720 on the sidewalls of nitride strips 710. The spacers will be used to define the floating gates as shown in FIG. 8. More particularly, nitride 710 is removed, and polysilicon 120 is etched with oxide spacers 720 as a mask. The etch stops on oxide 140. Polysilicon 120 is thus patterned into strips that run through the array in the column direction on both sides of the bitlines 160 (the polysilicon geometry is thus similar to that of FIGS. 4-6).

Then a connection implant (type N) is performed to dope the connection strips 210$i$ (laid out as in FIG. 5) containing the connection regions 210, and to partially dope the bitlines 160. The implant parameters can be as described above for FIG. 4. Polysilicon 120 and oxide 720 mask this implant over the channel regions 220L, 220R.

A photoresist layer 910 (FIG. 9) is formed on the wafer and patterned to expose bitline regions 610. The openings in mask 910 can be the same as described above for the mask 610 (FIG. 6), with the mask edges being positioned anywhere over the polysilicon 120. Oxide 720 may be removed before the formation of mask 910, or may be left intact.

An N+ dopant is implanted to dope the bitlines 160. The implant parameters can be as described above for FIG. 6.

Photoresist 910 and oxide 610 are removed. The memory fabrication can be completed in the same way as for FIG. 6.

In another variation, the nitride strips 710 (FIGS. 7A, 7B) are formed over connection strips 210$i$ rather than over bitline regions 160.

Figure 10A:
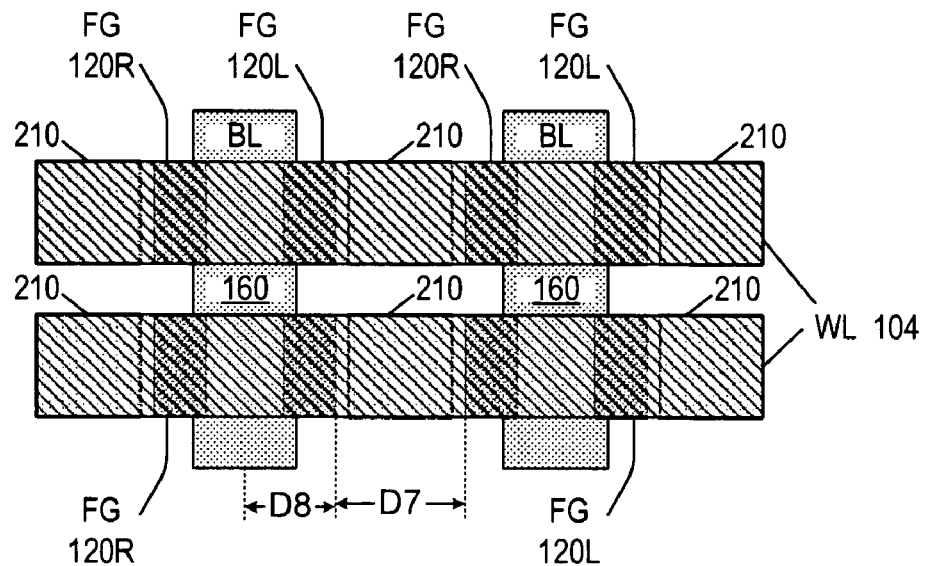
FIG. 10A is a top view of a memory array in some embodiments of the present invention.

FIGS. 10A (top view), 10B (vertical cross section) illustrate another memory array embodiment. The circuit diagram is as in FIG. 2A. The floating gates 120 are formed as sidewall spacers in trenches 1010 in substrate 130. Each trench 1010 can traverse the entire array in the column direction, or can be limited to a single cell. Bitlines 160 are doped regions passing at the bottom of trenches 1010. Connection regions 210 are located between the trenches 1010. Small dimensions can be obtained. Also, the capacitive coupling between the wordlines 104 and the underlying floating gates 120 can be increased simply by increasing the trench depth without increasing the cell area. In some embodiments, the distance D7 between the adjacent floating gates 120L, 120R in a memory cell is 0.08 μm. The distance D8 between the right edge of floating gate 120L and the middle of the adjacent bitline 160 on the left side of the cell is 0.085 μm. The same distance separates the left edge of floating gate 120R from the adjacent bitline 160 on the right side of the cell. The total cell width in the wordline direction is 2*D8+D7=0.25 μm. The wordline width D5 (FIG. 2B) and the spacing D6 between the adjacent wordlines are 0.13 μm and 0.07 μm respectively. Therefore, the cell size is 0.25*(0.13+0.07)=0.05 μm$^2$ for a feature size F=0.07 μm.

Figure 10B:
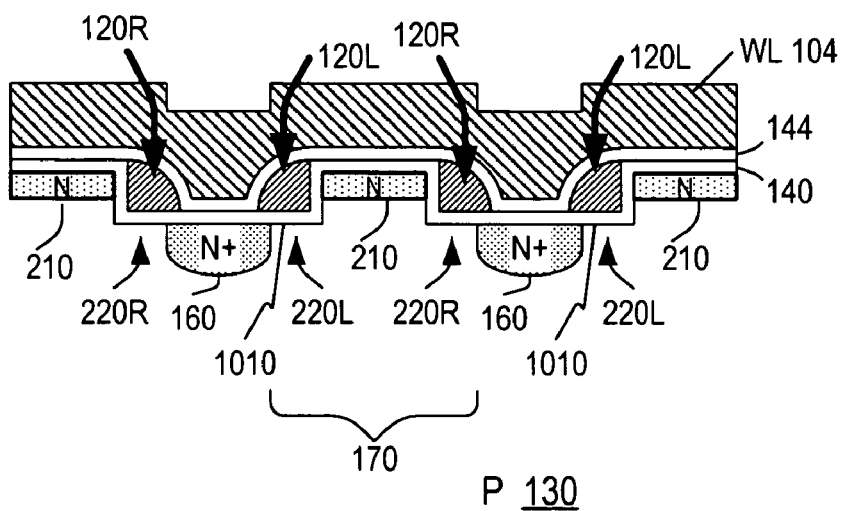
FIG. 10B shows a vertical cross section of the array of FIG. 9A in some embodiments of the present invention.
Figure 11:
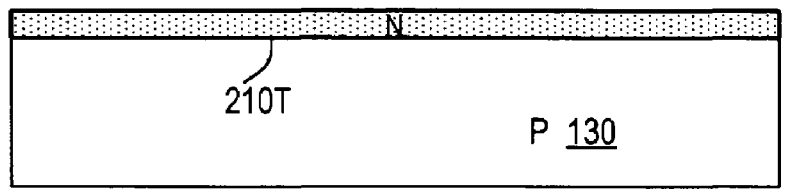
FIG. 11 shows a vertical cross section of a memory array in the process of fabrication according to some embodiments of the present invention.
Figure 12A:
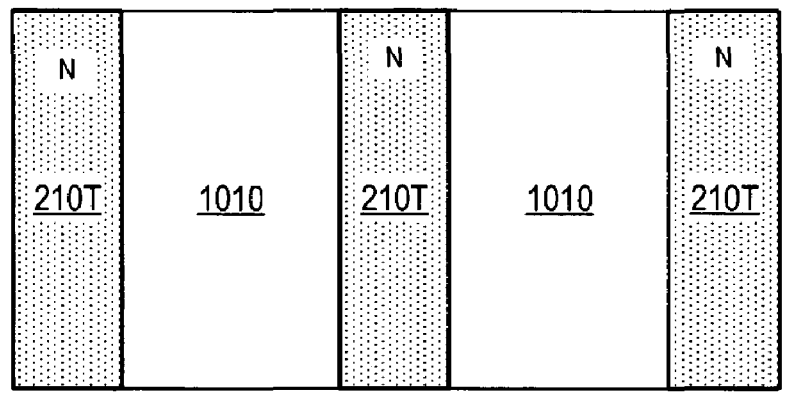
FIG. 12A is a top view of a memory array in the process of fabrication according to some embodiments of the present invention.
Figure 12B:
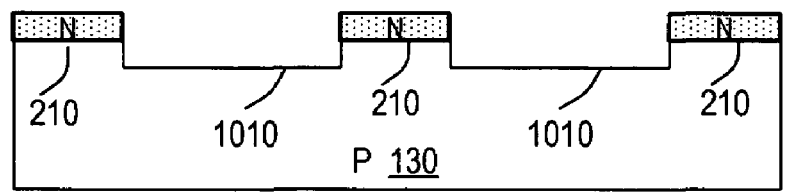
FIGS. 12B, 13 show vertical cross sections of memory arrays in the process of fabrication according to some embodiments of the present invention.
Figure 13:
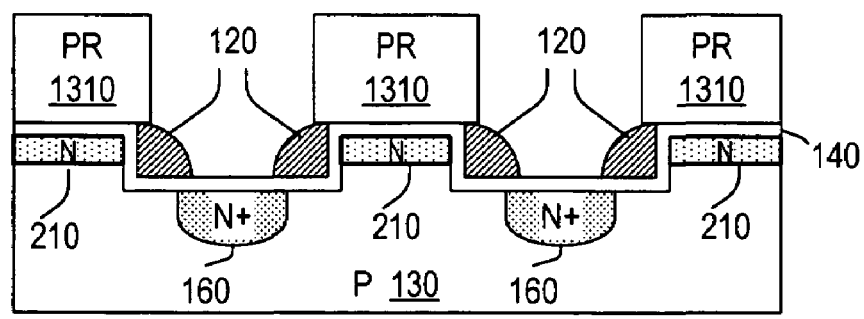

U.S. Pat. No. 5,705,415 issued Jan. 6, 1998 to Orlowski et al. describes some techniques to fabricate sidewall spacer floating gates in trenches. An exemplary fabrication process for the memory of FIGS. 10A, 10B is as follows. After forming the alignment marks and performing threshold adjust implants, an N type connection implant is performed into the entire memory array, without a mask over the array area, to form an N type region 210T (FIG. 11) at the top surface of P type substrate 130. Region 210T will provide the connection regions 210 between the trenches. The connection implant can be performed using the parameters described above in connection with FIG. 4. Then trenches 1010 are etched in substrate 130 to a suitable depth (e.g. 20~50 nm). See FIG. 12A (top view) and FIG. 12B (vertical cross section). In this embodiment, each trench 1010 traverses the entire memory array in the column direction. The trench depth exceeds the depth of region 210T in this embodiment, but this is not necessary. Tunnel oxide 140 (FIG. 13) is formed by thermal oxidation as described above in connection with FIG. 4. A polysilicon layer 120 is deposited over the wafer to fill the trenches 1010 and provide a planar top surface over substrate 130 in the array area. The polysilicon is etched anisotropically without a mask over the array, to form polysilicon spacers 120. Each spacer 120 runs around the corresponding trench over the trench's sidewalls and bottom corners. Photoresist 1310 is formed on the wafer and patterned to open the bitlines 160. The edges of the resist mask 1310 can be positioned anywhere over the spacer 120 portions running in the column direction. An N+ type dopant implantation is performed to dope the bitlines, possibly using the same techniques as described above for FIG. 6.

Figure 9:
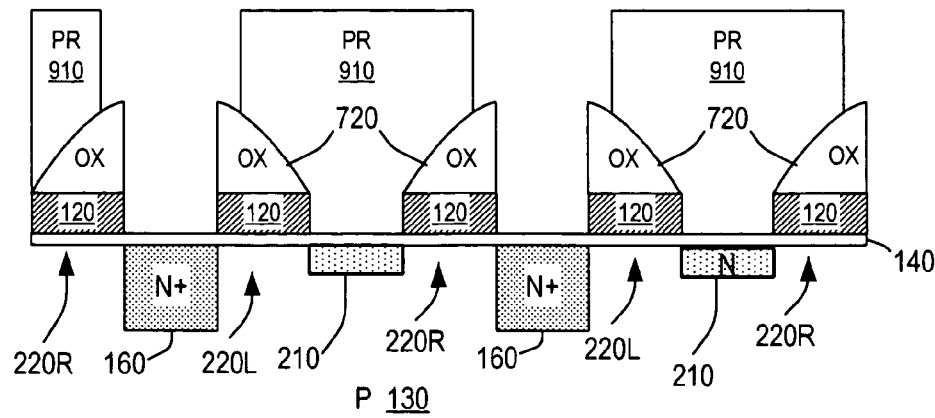

The remaining fabrication steps can be as in the embodiments of FIG. 6 or 9. Briefly, photoresist 1310 is removed. Dielectric 144 and then polysilicon 104 are formed on the wafer (see FIG. 10B). Layers 144, 104, 120 are patterned using a single photolithographic mask to form the wordlines and to remove the layer 120 between the wordlines. Then a P type channel stop implant can be performed into substrate 130, with wordlines 104 as a mask. This implant counter-dopes the regions 210T between the wordlines, possibly changing them to the P conductivity type.

The invention is not limited to the materials described. For example, doped polysilicon can be replaced with other conductive materials, and silicon dioxide can be replaced with other dielectrics. The P and N conductivity types can be reversed. P type substrate 130 can be replaced with an isolated P type well in P or N type substrate. The dimensions are exemplary and not limiting. Other embodiments and variations are within the scope of the invention, as defined by the appended claims.

The invention claimed is:

1. An integrated circuit comprising:
   a semiconductor region comprising a first surface, the semiconductor region comprising two source/drain regions of a nonvolatile memory extending from the first surface into the semiconductor region, the two source/drain regions having a first conductivity type, the two source/drain regions being separated by a channel region in the semiconductor region;
   a plurality of conductive floating gates formed over the semiconductor region adjacent to the first surface and the channel region;
   a conductive gate overlying each of the floating gates; and
   dielectric insulating the floating gates from the conductive gate and the semiconductor region;
   wherein the channel region comprises:
   a plurality of channel sub-regions of a second conductivity type opposite to the first conductivity type, each channel sub-region being adjacent to a respective one of the floating gates; and
   a connection region of the first conductivity type extending from the first surface into the semiconductor region, the connection region interconnecting two of the channel sub-regions, and at least one of the conditions (A) and (B) holds true:
   (A) the connection region has a lower net doping concentration at the first surface than each of the two source/drain regions;
   (B) the connection region is more shallow than each of the two source/drain regions.

2. The integrated circuit of claim 1 wherein the plurality of conductive floating gates consists of two floating gates.

3. The integrated circuit of claim 1 wherein the semiconductor region comprises a plurality of bitlines of the first conductivity type at the first surface, the nonvolatile memory comprises a plurality of memory cells, and the two source/drain regions are source/drain regions of one of said memory cells, each memory cell comprising two source/drain regions provided by two of said bitlines and also comprising a channel region in the semiconductor substrate;
   wherein each memory cell comprises a plurality of conductive floating gates formed over the semiconductor region adjacent to the first surface and to the memory cell's channel region;
   wherein each memory cell comprises a conductive gate overlying each of the memory cell's floating gates, and the integrated circuit comprises a plurality of first conductive lines each of which passes over a plurality of said bitlines, each first conductive line providing an interconnection for a plurality of said conductive gates; and
   wherein said dielectric insulates the floating gates from the conductive gates, the first conductive lines, and the semiconductor region;
   wherein each channel region comprises:
   a plurality of channel sub-regions of a second conductivity type opposite to the first conductivity type, each channel sub-region being adjacent to a respective one of the floating gates; and
   a connection region of the first conductivity type adjacent to the first surface, the connection region interconnecting two of the channel sub-regions, wherein at least one of the conditions (A) and (B) holds true:
   (A) the connection region has a lower net doping concentration at the first surface than the bitlines;
   (B) the connection region is more shallow than the bitlines.

4. The integrated circuit of claim 1 wherein the semiconductor region comprises a trench, the first surface comprises a surface of the trench and a surface adjacent to the trench, and the floating gates are located in the trench.

5. An integrated circuit comprising:
   a semiconductor region comprising a first surface, the semiconductor region comprising two source/drain regions of a nonvolatile memory extending from the first surface into the semiconductor region, the two source/drain regions having a first conductivity type, the two source/drain regions being separated by an channel region in the semiconductor region;
   a plurality of conductive floating gates formed over the semiconductor region adjacent to the first surface and to the channel region;
   a conductive gate overlying each of the floating gates; and
   dielectric insulating the floating gates from the conductive gate and the semiconductor region;

wherein the channel region comprises:
a plurality of channel sub-regions of a second conductivity type opposite to the first conductivity type, each channel sub-region being adjacent to a respective one of the floating gates; and
a connection region of the first conductivity type extending from the first surface into the semiconductor region, the connection region interconnecting two of the channel sub-regions, the connection region being more shallow than each of the two source/drain regions.

6. An integrated circuit comprising:
a semiconductor region comprising a first surface, the semiconductor region comprising two source/drain regions of a nonvolatile memory extending from the first surface into the semiconductor region, the two source/drain regions having a first conductivity type, the two source/drain regions being separated by an channel region in the semiconductor region;
a plurality of conductive floating gates formed over the semiconductor region adjacent to the first surface and to the channel region;
a conductive gate overlying each of the floating gates; and
dielectric insulating the floating gates from the conductive gate and the semiconductor region;
wherein the channel region comprises:
a plurality of channel sub-regions of a second conductivity type opposite to the first conductivity type, each channel sub-region being adjacent to a respective one of the floating gates; and
a connection region of the first conductivity type extending from the first surface into the semiconductor region, the connection region interconnecting two of the channel sub-regions, the connection region not being connected to any driver.

7. The integrated circuit of claim 6 wherein the plurality of conductive floating gates consists of two floating gates.

8. The integrated circuit of claim 6 wherein the semiconductor region comprises a plurality of bitlines of the first conductivity type at the first surface, the nonvolatile memory comprises a plurality of memory cells, and the two source/drain regions are source/drain regions of one of said memory cells, each memory cell comprising two source/drain regions provided by two of said bitlines and also comprising a channel region in the semiconductor substrate;
wherein each memory cell comprises a plurality of conductive floating gates formed over the semiconductor region adjacent to the first surface and to the memory cell's channel region;
wherein each memory cell comprises a conductive gate overlying the floating gates, and the integrated circuit comprises a plurality of first conductive lines each of which passes over a plurality of said bitlines, each first conductive line providing an interconnection for a plurality of said conductive gates; and
wherein said dielectric insulates the floating gates from the conductive gates, the first conductive lines, and the semiconductor region;
wherein each channel region comprises:
a plurality of channel sub-regions of a second conductivity type opposite to the first conductivity type, each channel sub-region being adjacent to a respective one of the floating gates; and
a connection region of the first conductivity type adjacent to the first surface, the connection region interconnecting two of the channel sub-regions, the connection region not being connected to any driver.

9. The integrated circuit of claim 6 wherein the semiconductor region comprises a trench, the first surface comprises a surface of the trench and a surface adjacent to the trench, and the floating gates are located in the trench.

10. The integrated circuit of claim 1 wherein the connection region has a lower net doping concentration at the first surface than each of the two source/drain regions.

11. The integrated circuit of claim 1 wherein both of the conditions (A) and (B) hold true.

12. The integrated circuit of claim 1 wherein the connection region is in physical contact with only semiconductor material of the second conductivity type or with the semiconductor material of the second conductivity type and dielectric.

13. The integrated circuit of claim 1 wherein the connection region is not connected to any bitline sensing circuitry or any driver.

14. The integrated circuit of claim 5 wherein the connection region is in physical contact with only semiconductor material of the second conductivity type and dielectric.

15. The integrated circuit of claim 5 wherein the connection region is not connected to any bitline sensing circuitry or any driver.

16. The integrated circuit of claim 6 wherein the connection region is in physical contact with only semiconductor material of the second conductivity type and dielectric.

17. The integrated circuit of claim 6 wherein the connection region is not connected to any bitline sensing circuitry or any driver.

* * * * *